United States Patent
Sugiyama et al.

(10) Patent No.: US 7,172,839 B2
(45) Date of Patent: Feb. 6, 2007

(54) PHOTOMASK CORRECTION METHOD USING COMPOSITE CHARGED PARTICLE BEAM, AND DEVICE USED IN THE CORRECTION METHOD

(75) Inventors: Yasuhiko Sugiyama, Chiba (JP); Junichi Tashiro, Chiba (JP); Anto Yasaka, Chiba (JP)

(73) Assignee: SII NanoTechnology Inc. (JP)

( * ) Notice: Subject to any disclaimer, the term of this patent is extended or adjusted under 35 U.S.C. 154(b) by 185 days.

(21) Appl. No.: 10/721,522

(22) Filed: Nov. 24, 2003

(65) Prior Publication Data
US 2004/0131953 A1    Jul. 8, 2004

(30) Foreign Application Priority Data
Nov. 27, 2002   (JP)   ............................. 2002-344140

(51) Int. Cl.
  *G03F 9/00*     (2006.01)
  *C03C 15/00*    (2006.01)
  *G01L 21/30*    (2006.01)
(52) U.S. Cl. ............................. 430/5; 216/59; 216/66
(58) Field of Classification Search .................... 430/5, 430/30, 394; 250/492.21, 492.22, 492.3; 216/59, 66
See application file for complete search history.

(56) References Cited

U.S. PATENT DOCUMENTS

| 5,272,116 | A | * | 12/1993 | Hosono | ......................... 430/5 |
| 5,882,823 | A | * | 3/1999 | Neary | ............................. 430/5 |
| 6,096,459 | A | * | 8/2000 | Yang | .............................. 430/5 |
| 2003/0215722 | A1 | * | 11/2003 | Kanamitsu et al. | ............. 430/5 |
| 2004/0151991 | A1 | * | 8/2004 | Stewart et al. | .................. 430/5 |

* cited by examiner

*Primary Examiner*—S. Rosasco
(74) *Attorney, Agent, or Firm*—Adams & Wilks

(57) ABSTRACT

The object of the present invention is to provide a method for solving the problem of surface damage due to gallium ion irradiation that poses a problem when carrying out mask repair using currently established FIB techniques, and the problem of residual gallium, and to provide a device realizing this method. The device of the present invention has an electron beam lens barrel that can carry out processing, as well as an FIB lens barrel, provided inside the same sample chamber, which means that a mask repair method of the present invention, in correction processing to remove redundant sections such as a mask opaque defect, phase shift film bump defect or a glass substrate cut remnant defect, comprises a step of coarse correction by etching using a focused ion beam and a step of finishing processing using an electron beam, to remove surface damage due to gallium irradiation, and residual gallium.

6 Claims, 4 Drawing Sheets

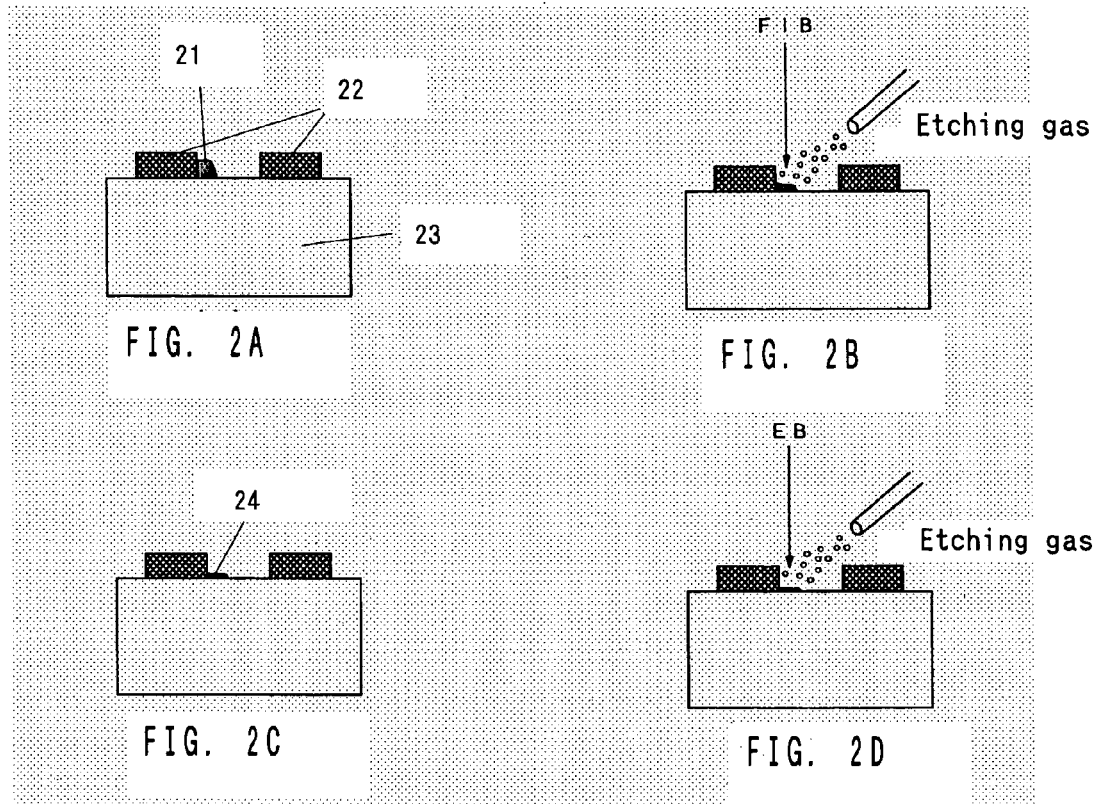
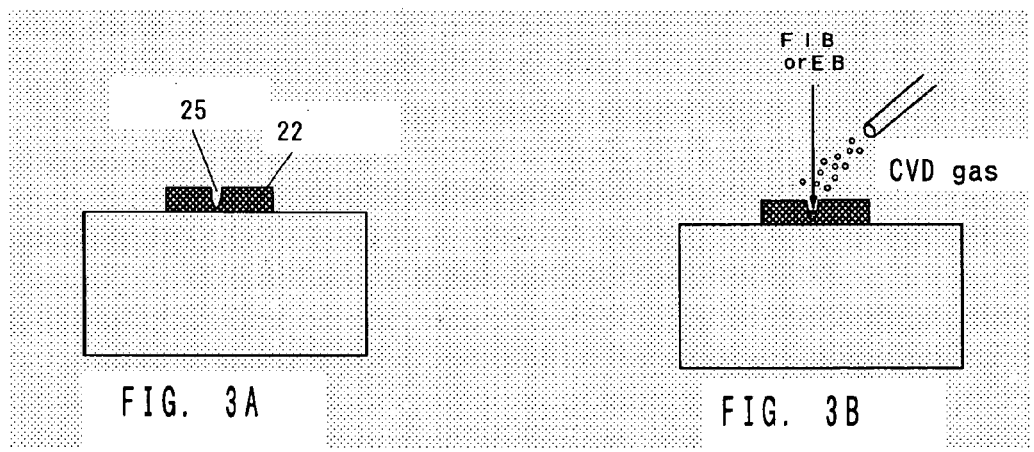

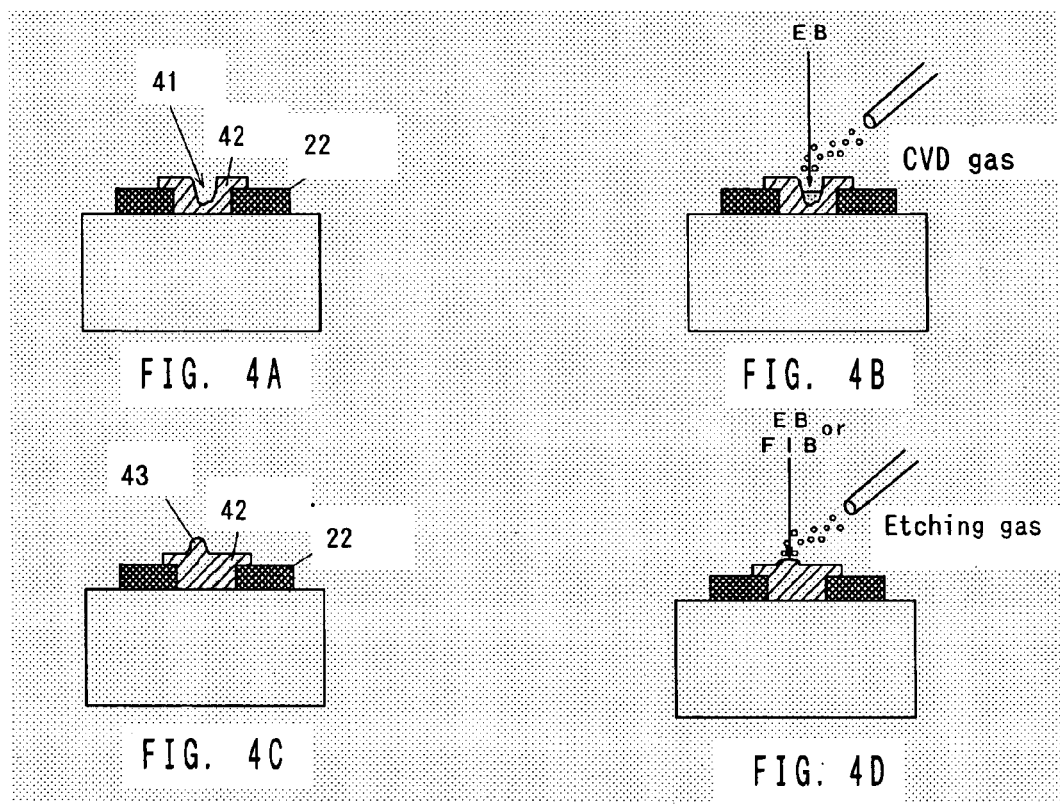
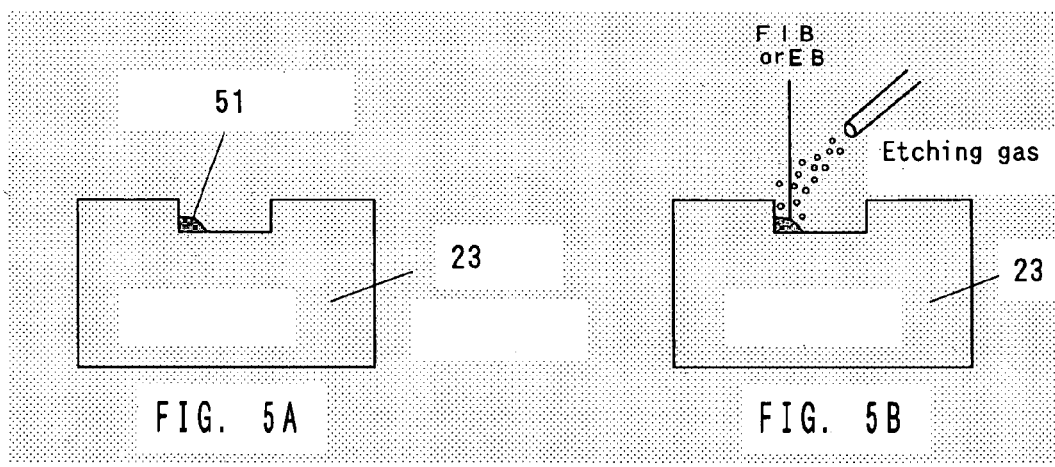

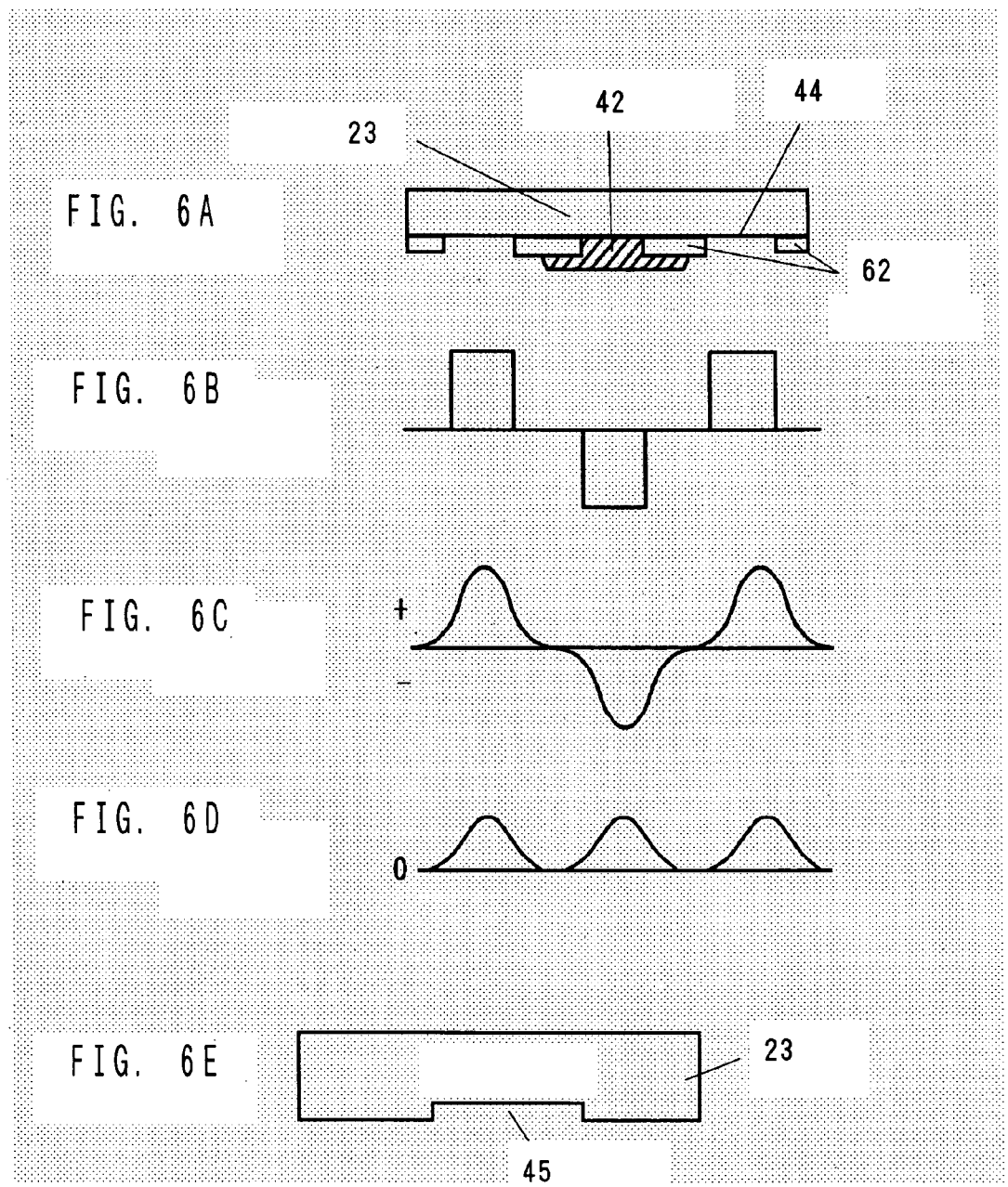

PHOTOMASK CORRECTION METHOD USING COMPOSITE CHARGED PARTICLE BEAM, AND DEVICE USED IN THE CORRECTION METHOD

BACKGROUND OF THE INVENTION

1. Technical Field

The present invention relates to a mask correction method that combines correction using a focused ion beam and correction using an electron beam, and to a device realizing this.

2. Related Art

So-called transparent defect correction for repairing defect sections of a mask used in semiconductor manufacturing processes, and so-called opaque defect correction for removing additional sections are carried out using technology such as deposition carried out by irradiating a focused ion beam (FIB) while spraying a source material gas, and sputter etching and gas assisted etching for irradiating a focused ion beam. Currently, this technology is established in the field of FIB mask repair. However, gallium, which is a liquid metal, is generally used as the ion material for this focused ion beam, and there is a problem that the sample surface is damaged by Ga ions irradiated In the course of processing. Accordingly, since at a coarse processing stage processing is carried out at a high acceleration voltage, a procedure is necessary to carefully perform finishing processing of a sample surface that has been subjected to damage because of this high acceleration voltage with a low acceleration voltage at the finishing processing stage, and polish the damaged sample surface. Although it is possible to repair the roughened sample surface using this procedure, since gallium is used as the ion material, the gallium is injected into a mask, which is the sample, and this injected gallium remains in the finished mask. When this mask is used in lithography, the remaining gallium absorbs light and adversely affects transparency, and causes an imbalance in intensity of light irradiated to resist. Because the latest semiconductor patterns are becoming extremely detailed, it is necessary to use light of short wavelength as a light source in order to obtain a clear transfer image. The problem of this light absorption is therefore particularly serious when using light at a wavelength of 157 nm.

Recently, photolithography using phase shift masks in order to increase mask resolution has been widely used in the manufacture of semiconductor circuits. This lithography is intended to improve mask resolution using phase difference of light as well as light amplitude distribution. One example of a photolithography method (phase shift method) using a phase shift mask is shown in FIG. 6a, FIG. 6B, FIG. 6C and FIG. 6D. FIG. 6A is a cross sectional drawing of a phase shift mask, having a shaded pattern formed on the surface of a glass substrate 23 using Cr. A subsequent shaded pattern 62 is formed extremely close to one shaded pattern, and an open section 44 is formed between adjacent shaded patterns. These are repeatedly formed in the same manner. Also, a transparent film is formed in every other open section 44, and this is called a phase shifter film 42. The material of the phase shifter film 42 is a transparent material, and can be an inorganic material such as magnesium fluoride, titanium dioxide or silicon dioxide, or an organic material such as a polymer. It is also useful to use a resist material for the phase shift film 42.

In FIG. 6A, coherent light irradiated from above passes through each open section 44, and binds an image on the wafer either directly or via a lens optical system. Light passing through the phase shifter film 42 has light phase shifted by 180° compared to the light that has not passed through the phase shifter film. Amplitude distribution of light passing through the mask open sections is as shown in FIG. 6B. Specifically, light that has passed through open sections 44 in the phase shifter film 42 and light that has passed through open sections 44 that are not in the phase shifter film 42 are 180° out of phase with each other. Also, since light that has passed through the open sections 44 is diffracted, diffracted light also reaches the wafer corresponding to sections in the shadow of the shaded pattern 62. Therefore, amplitude (strength) of light reaching the wafer is as shown in FIG., 6C. Light diffracted at shadow sections of a particular shaded pattern 62 and rotated from left and right open sections is 180° out of phase with each other. That is, negating this, the strength distribution of light irradiated on the wafer becomes as shown in FIG. 6D. Specifically, an image of the open section is clearly separated. Also, besides the phase shifter film, there is also a method of forming a groove 45 in the glass substrate and causing phase shift, as shown in FIG. 6E.

With respect to the mask correction method, not only techniques such as CVD and etching using an FIB, but also CVD and gas assisted etching using an electron beam as an energy beam are disclosed in previous patents. For example, patent document 1 (Japanese Patent Laid-open No. Hei. 4-125642) shows a technique, intended to correct defects occurring in a transparent film of a photo mask used for phase shift with high precision, wherein gas for CVD is attached to a main surface of a photomask, and a correction film is then deposited onto the defect regions by selectively irradiating an energy beam to the defect regions. Also disclosed is, after causing etching gas to be attached to the main surface of the photomask, etching the defect regions by selectively irradiating the defect regions with an energy beam. Further, there is disclosed deposition of a transparent film by selective irradiation of the energy beam on part of a transparent region of the main surface of the photomask, for the purpose of forming a transparent film on the main surface of a phase shift photomask. Here, a focused ion beam and an electron beam are included as examples of the energy beam.

Patent document 2 (Japanese Patent Laid-open No. Hei. 5-114336) discloses a technique of etching defect sections of a phase shift mask until the defect sections become a substantially flat thin film, and then changing a refractive index of a phase shifter of the defect regions that have been substantially flattened by carrying out ion implantation by irradiation of an ion beam so that there is no phase difference, and also discloses a method of irradiating a heat energy beam such as an electron beam to change a refractive index by causing thermal strain, for the purpose of carrying out correction to defects of a phase shifter of a phase shifter mask simply and with high precision Also, patent document 3 (Japanese Patent Laid-open No. Hei. 6-42069) discloses a technique of irradiating an electron beam in a material gas atmosphere to correct missing defects by forming a shading film on the correction regions, for the purpose of enabling correction of missing defects of a photomask in a short time.

However, even though a technique for changing refractive index by gas assisted etching or CVD using an electron beam, or by causing thermal strain, are disclosed in the above patent documents, there is neither direct disclosure of damage caused by gallium ions of an FIB, the effect of gallium ions remaining in a mask, and removing the effect by separately using an ion beam and an electron beam taking into consideration differences in their characteristics, and the technical concept of providing a mask repair device in mask correction provided with two lens barrels to compensate for the drawbacks by using two separate beams, nor any suggestion of any recognition of these problems.

Patent document 1: Japanese Patent Laid-open No. Hei. 4-125642, FIG. 1, FIG. 2, FIG. 7 and FIG. 8.

Patent document 2: Japanese Patent Laid-open No. Hei. 5-114336, claim 6 and paragraph [0037].

Patent document 3: Japanese Patent Laid-open No. Hei. 6-42069, page 4 column 7, line 44-column 8, line 4.

SUMMARY OF THE INVENTION

The object of the present invention is to provide a method for solving the problem of surface damage due to gallium ion irradiation that poses a problem when carrying out mask repair using currently established FIB techniques, and the problem of residual gallium, and to provide a device realizing this method.

A mask repair method of the present invention first of all carries out removal so that only a thin film remains by etching using an FIB in the event that there are opaque defects, and as finishing then either executes a step of removing the thin film contaminated with gallium by gas assist etching using an electron beam, and carries out removal by only gas assisted etching using an electron beam for bump defects of a phase shift mask, or first carries out removal so that only a thin film remains by etching using an FIB and then removes the thin film contaminated with gallium using gas assisted etching with an electron beam.

As a composite charged particle beam device for mask correction of the present invention, it is possible to perceive timing for changing from coarse processing using an FIB to finishing processing using an electron beam while monitoring processing conditions, by providing a gas introduction device provided with an electron beam lens barrel capable of carrying out processing besides an FIB lens barrel in the same sample chamber, and also spraying a CVD source material gas and/or an etching assist gas to a beam irradiation position, and a secondary charged particle detector, capable of discriminatively detecting secondary ions as well as secondary electrons.

BRIEF DESCRIPTION OF THE DRAWINGS

FIG. 2 is a drawing for describing the mask correction method of the present invention, for opaque defects.

FIG. 3 is a drawing for describing a mask correction method carried out using the device of the present invention, for transparent defects.

FIG. 4 is drawing for describing a correction method of the present invention, for void defects and bump defects of a phase shifter film.

FIG. 5 is a drawing for describing a correction method of the present invention, for a cut remnant defect of a glass substrate of a phase shift mask.

FIG. 6 is a drawing for describing the principal of a phase shift photomask.

DESCRIPTION OF THE PREFERRED EMBODIMENTS

Figure 1:
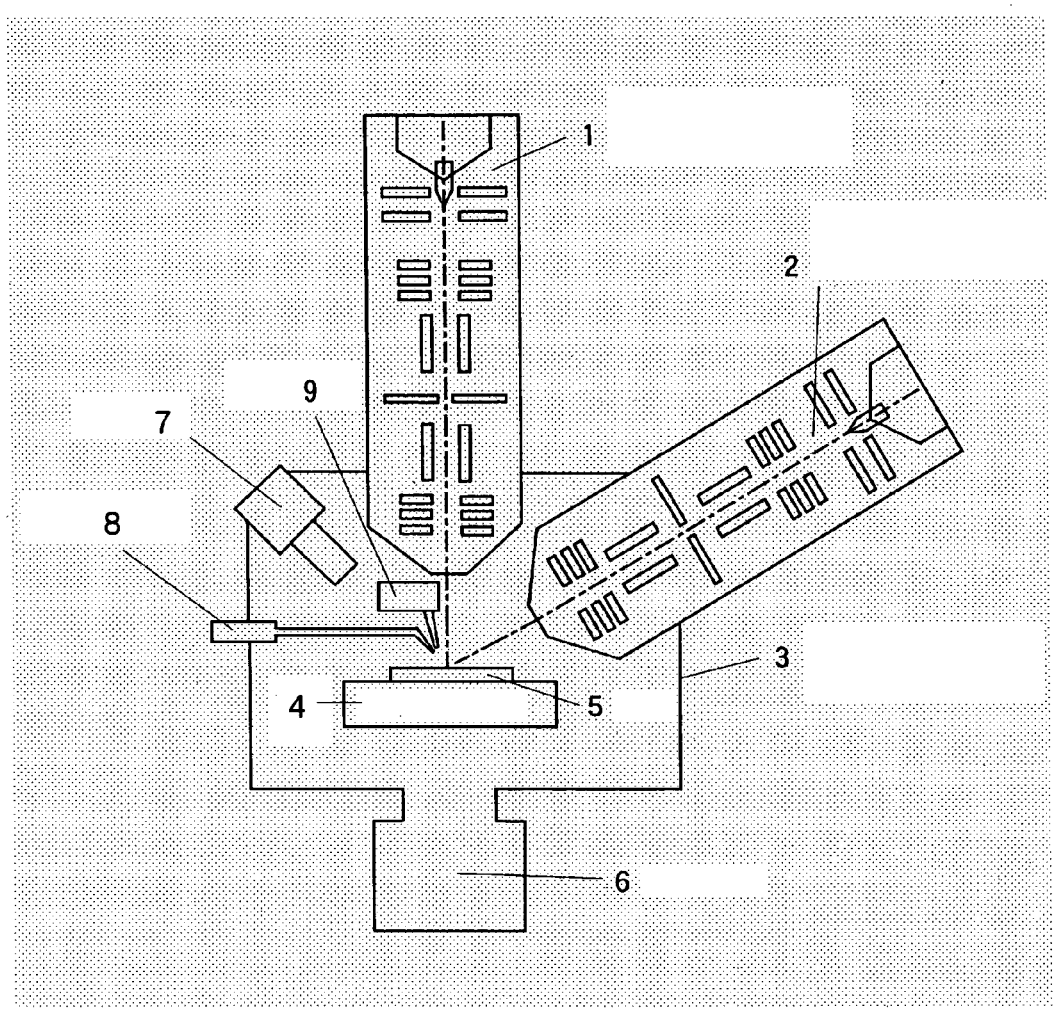
FIG. 1 is a drawing showing the basic structure of a device for executing a mask correction method using a composite secondary charged particle beam of the present invention.

The present invention selectively executes deposition or etching carried out using a focused ion beam or electron beam, using a device provided with a focused ion beam lens barrel and an electron beam lens barrels capable of processing in a sample chamber, and a gas gun for spraying CVD source gas or assist gas for gas assisted etching to a beam irradiation position. FIG. 1 shows the basic structure of this type of composite charged particle beam device. Reference numeral 1 is a focused ion beam lens barrel, 2 is an electron beam lens barrel, 3 is a sample chamber, 4 is a sample stage, 5 is a sample, 6 is a vacuum pump, 7 is a secondary charged particle detector, 8 is a gas introduction device, and 9 is a charge neutralizer for neutralizing charge on a sample surface. This secondary charged particle detector 7 detects secondary electrons and secondary ions by mass separation, and it is preferable to provide a function that can identify the type of particle detected. In FIG. 1, the device is of a type where the optical axes of the FIB lens barrel 1 and the electron beam lens barrel 2 intersect, but it is also possible to have a device of the type where the two optical axes are set up parallel to each other. However, the electron beam lens barrel 2 used in the present invention is different to that for a scanning microscope installed in a conventional device for observation, and utilizes a large beam current (up to a few nA) so that it can also be used in processing. Incidentally, if it is for observation, beam current used is fixed from a few pA to a few tens of pA. Also, the FIB lens barrel 1 is used with beam current being fixed from a few pA to a few tens of pA.

A mask correction method of the present invention carried out using the above device will now be described. First of all, in order to carry out observation of a correction region, an electron beam or a focused ion beam is scanned and a microscope image is acquired by detecting a secondary electron image using the detector 7. Defect sections are identified by image observation, and positioning for the mask correction region is carried out. In particular, when it is desired to reduce damage due to imaging, positioning of the correction regions is carried out by acquiring an SEM image with an electron beam without using a focused ion beam. When a defect is a mask residual defect (opaque defect) 21 such as that shown in cross section in FIG. 2A, in order to remove the opaque defect 21, etching gas is sprayed and directed from the gas introduction device 8 to the defect region, and a focused ion beam is irradiated to the defect region. Then, as shown in FIG. 2B, irradiation of the focused ion beam is stopped with a small amount of residual material remaining, without completely removing the defect. This processing is gas assisted etching with liquid gallium as an ion source, which means that gallium is implanted into the remaining part of this opaque defect. Since there is part of the mask where light passes through, if the opaque defect is contaminated with gallium, then even if the opaque defect is removed there is light absorption at that part and there will be the above described problems in a lithographic process. In order to remove the opaque defect 24 remaining, as shown in FIG. 2C, etching gas ($XeF_2$) is sprayed to the remaining defect region, and as shown in FIG. 2D, this time an electron beam is irradiated to that region, and the defect section is removed completely. This processing is gas assisted etching using an electron beam, which means that there is no injection of gallium into the sample, and the gallium that was implanted by the previous ion beam process is removed together with the residual opaque defect. This is the opaque defect correction method of the present invention.

This photomask opaque defect correction is good for acquiring transparency of a glass substrate section, and with respect to thickness of a glass substrate, differing from the case of a phase shifter, which will be described later, there is no requirement for stringency. Bearing this point in mind, with this opaque defect correction, using FIB processing the thin layer of the remaining opaque defect 24 shown in FIG. 2C will be completely removed without leaving any behind, and even with a process for removing a gallium impregnation layer incidentally injected into the glass substrate using an electron beam, there is no particular problem. In that case, it is possible to terminate FIB processing by detecting that there is no longer any opaque defect using the ion type identification function of the secondary charged particle detector 7, and automatically switching to electron beam processing, which is extremely advantageous from the point of view of working capacity.

Also, in the case where the observed defect is a mask void defect (transparent defect) 25, as shown in cross section in FIG. 3A, then in order to remove the transparent defect 25, CVD source material gas is sprayed to the defect region as shown in FIG. 3B, and a focused ion beam or an electron beam is irradiated to that region. In this way, the defect is corrected by forming a localized film by deposition using an ion beam or an electron beam. With a conventional mask in the case of a normal transparent defect, since there is a region where light is shielded, there is no problem due to light absorption even if liquid gallium is used in the ion source and gallium elements are implanted into the correction region. Accordingly, for transparent defects, it is possible to carry out correction using a focused ion beam.

Next, a correction procedure when a sample is a phase shift mask will be described. Similarly to the previous case, first of all, in order to carry out observation of the correction region, an electron beam or a focused ion beam is scanned and a secondary electron image is detected by the detector 7 to acquire a microscope image. Defect regions are identified using image observation and the mask correction regions are positioned. If damage to the phase shifter film 42 is taken into consideration, it is preferable to carry out observation with an SEM image using an electron beam. In the case where the observed defect 41 is a void defect in the phase shifter film 42 such as shown in cross section in FIG. 4A, in order to fill up and correct the void defect 41 as shown in FIG. 4B, CVD gas (Silicon type gas such as TEOS) is sprayed to the defect region and an electron beam EB is irradiated to that region. In this way, it is possible to form a transparent film and to correct the phase shifter film 42. Since the phase shift film has a region that light passes through, in processing at this time a focused ion beam that would cause a problem of gallium contamination is not used, and instead deposition is carried out using an electron beam.

Also, FIG. 4C is a cross sectional drawing of a bump defect 43 on the phase shifter film 42 of a phase shift mask. This bump defect 43 is a redundant defect, basically the same as the opaque defect, and must be removed. In order to remove the bump defect, etching gas is sprayed and directed to the defect region, as shown in FIG. 4D, and an electron beam or focused ion beam is irradiated to that region to remove it by gas assisted etching. As described previously, this phase shifter film 42 constitutes a region of a mask through which light passes, and therefore no light absorption problem arises if gallium remains. When correction is carried out by etching using an electron beam from the start, this gallium residue contamination problem does not arise. However, when removing a bump defect using gas assisted etching using a focused ion beam because the bump defect is large or the like, similarly to the case of the opaque defect, the bump defect is not completely removed and remains thinly. Gallium is implanted and injected into this thinly remaining defect section. Then, as finishing processing to remove this gallium contaminated section etching gas is sprayed to the defect region and an electron beam is irradiated to that region. It is possible to remove a damaged section caused by the ion beam irradiation and the bump defect region by this gas assisted etching using an electron beam.

In the case of this phase shift mask, differing from the previous case of the photomask, the glass substrate is not simply transparent, and the thickness dimension of the glass substrate influences phase of light. Therefore, in the FIB processing, a thin layer of redundant defect, such as an opaque defect, remains, and in finishing processing it is essential not to shave off the glass substrate. For example, in a pretest, secondary ion detection is carried out and the time until opaque defect material is no longer detected measured, and when carrying out actual processing, processing time corresponding to the defect is calculated from that measured time and it is possible to have a method where processing using the FIB is terminated.

Also, FIG. 5A shows a cross section of a cut remnant defect when forming a phase shift mask by etching glass. A phase shift mask that has been cut out will not perform the intended phase shift if the depth of the cut-out is not that required for the phase shift. Accordingly, a method for correcting this cut remnant defect 51 is realized in conformity with the previous cases for the opaque defect and phase shift film bump defect, since it is basically a redundant defect. That is, using the device of the present invention, etching gas is sprayed to the defect region, and an electron beam or a focused ion beam is irradiated to that region to carry out gas assisted etching, as shown in FIG. 5B, to remove the defect. Because the cut out region of this glass substrate 23 constitutes a region of a phase shift mask through which light passes, if gallium remains, a light absorption problem will arise. In the case where correction is carried out by etching using an electron beam from the start, this problem of gallium residue contamination will not arise. However, when a bump defect is removed by gas assisted etching using a focused ion beam because the defect is large etc., similarly to the opaque defect the bump defect is not removed completely and a thin part remains. Since gallium is implanted and injected into this thinly remaining defect section, finishing processing is carried out by irradiating an electron beam to the gallium contaminated section to be removed and performing gas assisted etching.

Because the mask has the glass substrate 23, there is a problem of electrical charge in the process of irradiating the charged particles. This charge causes influence on electrostatic force at the time of beam irradiation, and impairs the observation image, and so with the process of the present invention, the charge is cancelled as required by operation of a charge neutralizer 9.

The mask correction method of the present invention, in a correction process for removing redundant sections such as photomask opaque defects of phase shifter bump defects, comprises the steps of coarse correction by etching using a focused ion beam, and then finishing processing using an electron beam, which means that even if correction processing using a focused ion beam is carried out, it is possible to remove surface damage due to gallium irradiation and residual gallium.

Also, by providing a composite charged particle beam device of the present invention with two lens barrels, namely an electron beam lens barrel capable of carrying out processing and an FIB lens barrel in the sample chamber, as well as providing a gas introduction device for spraying a CVD source material gas and/or an etching assist gas to a beam irradiation position, there is the advantage that it is possible to selectively perform etching or deposition carried out using a focused ion beam or an electron beam. In disadvantageous cases where there is gallium contamination in material filled into defect sections, such as a void defect of a phase shifter mask, it is possible to carry out deposition with only gas assisted etching using an electron beam, and in cases of correction processing to remove redundant sections such as mask opaque defects or phase shifter bump defects, it is possible to have steps of coarse correction by etching using a focused ion beam, and then finishing processing using a particle beam. It is also possible to carry out correction processing depending on the type of defect, so as to remove residual gallium due to gallium irradiation.

Also, when, using the composite charged particle beam device of the present invention, executing a mask correction method comprising a step of acquiring an SEM image with an electron beam and a step of positioning defect correction locations on the SEM image, there is no problem of damage and contamination of the sample surface due to a focused ion beam as there would be when using a scanning image using a focused ion beam.

Further, the mask correction composite charged particle beam device of the present invention can monitor processing state, due to the fact that it is provided with a secondary charged particle detector capable of discriminatively detecting secondary electrons and secondary ions. Accordingly, it is possible to terminate FIB processing by detecting that there is no longer any opaque defect, and automatically switch to electron beam processing, which is extremely advantageous with respect to working capacity

What is claimed is:

1. A method of correcting a redundant defect in a mask using a composite charged particle beam device, comprising the steps of:

provoiding a composite charged particle beam device having a focused ion beam lens barrel for producing a focused ion beam and an electron beam lens barrel for producing an electron beam;

scanning an electron beam produced by the electron beam lens barrel over a mask having a redundant defect to acquire an image of the mask;

identifying the position of the redundant defect from the image;

carrying out coarse correction of the redundant defect by etching using a focused ion beam produced by the focused ion beam lens barrel; and carrying out finishing correction of the coarsely corrected redundant defect by etching using an electron beam produced by the electron beam lens barrel.

2. A method of correcting according to claim 1; wherein the finishing correction is carried out while directing an etching assist gas to the coarsely corrected redundant defect being irradiated by the electron beam.

3. A method of correcting according to claim 1; wherein the redundant defect is an opaque defect; the coarse correction is carried out to completely remove the opaque defect while incidentally injecting ions of the focused ion beam into the mask; and the finishing correction is carried out to remove the injected ions from the mask.

4. A method of correcting according to claim 1; wherein the focused ion beam is comprised of gallium ions.

5. A method of correcting according to claim 1; further including the steps of detecting secondary ions generated during coarse correction of the redundant defect and, when the type of detected secondary ions changes, terminating the coarse correction.

6. A method of correcting according to claim 1; further including the steps of detecting secondary ions generated during coarse correction of the redundant defect and, when the type of detected secondary ions changes, terminating the coarse correction and automatically switching to finishing correction to repair damage to the mask that occurred during coarse correction.

* * * * *